US011081314B2

(12) United States Patent
Jungjohann et al.

(10) Patent No.: US 11,081,314 B2
(45) Date of Patent: Aug. 3, 2021

(54) INTEGRATED TRANSMISSION ELECTRON MICROSCOPE

(71) Applicant: National Technology & Engineering Solutions of Sandia, LLC, Albuquerque, NM (US)

(72) Inventors: Katherine L. Jungjohann, Sandia Park, NM (US); Khalid M. Hattar, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 17/035,267

(22) Filed: Sep. 28, 2020

(65) Prior Publication Data

US 2021/0098227 A1  Apr. 1, 2021

Related U.S. Application Data

(60) Provisional application No. 62/908,730, filed on Oct. 1, 2019.

(51) Int. Cl.
*H01J 37/28* (2006.01)
*H01J 37/147* (2006.01)
*H01J 37/12* (2006.01)

(52) U.S. Cl.
CPC .............. *H01J 37/28* (2013.01); *H01J 37/12* (2013.01); *H01J 37/1477* (2013.01); *H01J 2237/063* (2013.01); *H01J 2237/2007* (2013.01); *H01J 2237/2802* (2013.01)

(58) Field of Classification Search
CPC .. H01J 37/00; H01J 37/02; H01J 37/28; H01J 37/147; H01J 37/261; H01J 37/12; H01J 37/1477; H01J 37/1471; H01J 37/26; H01J 2237/063; H01J 2237/2802;
(Continued)

(56) References Cited

U.S. PATENT DOCUMENTS

| 2003/0132382 A1* | 7/2003 | Sogard | H01J 37/261 250/311 |
| 2015/0041647 A1* | 2/2015 | Tiemeijer | H01J 37/261 250/307 |
| 2016/0005566 A1* | 1/2016 | Zewail | G01N 23/20058 250/307 |

OTHER PUBLICATIONS

Li, Y. et al., "Complex Structural Dynamics of Nanocatalysts Revealed in Operando Conditions by Correlated Imaging and Spectroscopy Probes," Nature Communications, 2015, vol. 6, 7583, 6 pages.

(Continued)

*Primary Examiner* — Jason L McCormack
(74) *Attorney, Agent, or Firm* — Kevin W. Bieg

(57) ABSTRACT

An integrated transmission electron microscope comprising multiple electron sources for tuned beams of ultrafast, scanning probe, and parallel illumination in varied beam energies can be alternated within sub-microseconds onto a sample with dynamic 'transient state' processes to acquire atomic-scale structural/chemical data with site specificity. The various electron sources and condenser optics enable high-resolution imaging, high-temporal resolution imaging, and chemical imaging, using fast-switching magnets to direct the different electron beams onto a single maneuverable objective pole piece where the sample resides. Such multimodal in situ characterization tools housed in a single microscope have the potential to revolutionize materials science.

4 Claims, 4 Drawing Sheets

(58) Field of Classification Search
CPC ....... H01J 2237/2007; H01J 2237/2505; H01J 2237/14; H01J 2237/151
USPC .......................................... 250/306, 307, 311
See application file for complete search history.

(56) References Cited

OTHER PUBLICATIONS

Leenheer, A. J. et al., "Lithium Electrodeposition Dynamics in Aprotic Electrolyte Observed in Situ via Transmission Electron Microscopy," ACS Nano, 2015, vol. 9, pp. 4379-4389.

Kabius, B. et al., "First Application of Cc-Corrected Imaging for High Resolution and Energy-Fltered TEM, Journal of Electron Microscopy", 2009, vol. 58, pp. 147-155.

Robertson, I. M. et al., "Towards an Integrated Materials Characterization Toolbox," Journal of Materials Research, 2011, vol. 26, pp. 1341-1383.

Lagrange, T et al., "Nanosecond Time-Resolved Investigations Using the In Situ of Dynamic Transmission Electron Microscope (DTEM)", Ultramicroscopy, 2008, vol. 108, pp. 1441-1449.

Ross, Frances M. and Gibson, J. Murray, "Dynamic Observations of Interface Propagation during Silicon Oxidation," Physical Review Letters, 1992, vol. 68, pp. 1782-1785.

Hojo, D. et al., "Direct Observation of Two-Dimensional Growth at $SiO_2$/Si(111) Interface," Thin Solid Films, 2007, vol. 515, pp. 7892-7898.

Ferreira, P. J. "In Situ Transmission Electron Microscopy," MRS Bulletin, 2008, vol. 33, pp. 83-90.

Bayer, B. C. et al., "Atomic-Scale in Situ Observations of Crystallization and Restiructurng Processes in Two-Dimensional $MoS_2$ Films," ACS Nano, 2018, vol. 12, pp. 8758-8769.

Gammer, C. et al., "Local Nanoscale Strain Mapping of a Metallic Glass During In Situ Testing," Applied Physics Letters, 2018, vol. 112, 171905-1-171905-5.

Ramachandramoorthy, R. et al., "Pushing the Envelope of In Situ Transmission Electron Microscopy," ACS Nano, 2015, vol. 9, pp. 4675-4685.

Taheri, M. L. et al., "Current Status and Future Directions for In Situ Transmission Electron Microscopy," Ultramicroscopy, 2016, vol. 170, pp. 86-95.

\* cited by examiner

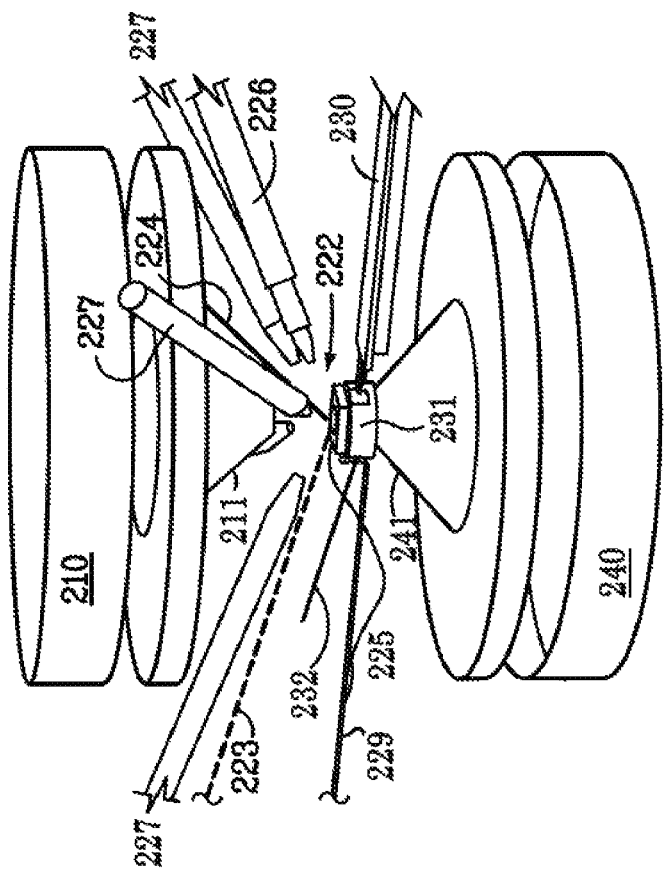
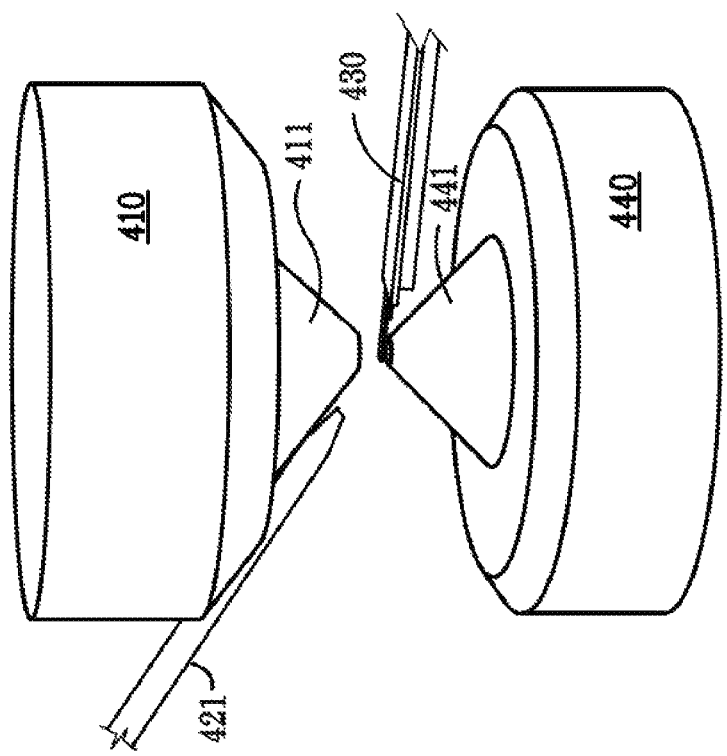

INTEGRATED TRANSMISSION ELECTRON MICROSCOPE

CROSS-REFERENCE TO RELATED APPLICATION

This application claims the benefit of U.S. Provisional Application No. 62/908,730, filed Oct. 1, 2019, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention is directed to an integrated transmission electron microscope that combines multiple electron emitters and beam pathways to converge onto a single electron-transparent sample, where timing between the varied beam pathways allows acquisition of atomic-scale structural information with chemical analysis during ultrafast dynamic processes in materials.

BACKGROUND OF THE INVENTION

The transmission electron microscope (TEM) was developed with the goal to achieve imaging at a spatial resolution beyond the diffraction limit of optical microscopy. See E. Ruska, *Rev. Mod. Phys.* 59(3), 627 (1987). The modern TEM not only has achieved this goal, but has surpassed expectations with the development of atomic-scale electronic and chemical mapping, z-contrast imaging in scanning transmission electron microscopy (STEM), atomic-scale tomographic reconstructions of small volumes of material, and imaging at picosecond temporal resolution of atomic events. See D. Muller et al., *Science* 319(5866), 1073 (2008); D. A. Muller, *Nat. Mater.* 8(4), 263 (2009); P. A. Midgley et al., *Chem. Commun.* 2001(10), 907 (2001); P. Nellist and S. Pennycook, "The principles and interpretation of annular dark-field Z-contrast imaging," in *Advances in imaging and electron physics*, Elsevier, p. 147-203 (2000); P. A. Midgley and R. E. Dunin-Borkowski, *Nat. Mater.* 8(4), 271 (2009); R. Xu et al., *Nat. Mater.* 14(11), 1099 (2015); B. Barwick et al., *Science* 322(5905), 1227 (2008); and M. T. Hassan et al., *Nat. Photon.* 11(7), 425 (2017). The true power of the scanning/transmission electron microscope (S/TEM) is not only the atomic-scale information, but the site specificity that allows researchers to find correlations between defects, impurities, grain boundaries, or dislocations in structures that can be tracked during a material process. These advancements are truly revolutionary, as demonstrated by several TEM-related Nobel prizes in the last century. See E. Ruska, *Rev. Mod. Phys.* 59(3), 627 (1987); A. L. Robinson, *Science* 234, 821 (1986); and D. Cressey and E. Callaway, *Nat. News* 550(7675), 167 (2017). The next frontier is investigating complex (multi stimulus) dynamic processes, mimicking real-world conditions (operando environments), in materials while retaining the same structural and chemical precision already demonstrated on idealized materials within a high vacuum, without introducing artifacts on the sample. The present invention is directed to an adaptive S/TEM that can pull together these state-of the-art capabilities into an integrated multimodal solution for understanding a single specimen with all the associated heterogeneities, and then quantify reactions of that specimen to multiple stimuli. Currently, there is no single S/TEM in the world capable of collecting atomic-scale Z-contrast imaging, with single-digit meV energy-resolved chemical mapping, and ultrafast picosecond imaging on a sample under a combination of tailored environments.

At present, to fully understand a material system or a reaction at the nanoscale, researchers must move the sample between optimized S/TEMs (accelerating voltage, spatial resolution, energy resolution, ultrafast temporal resolution, in-situ capabilities, direct-electron detection, or contrast-optimized imaging modes) housed in multiple laboratories across the globe. However, multimodal S/TEM investigations are currently limited by samples that can become compromised during transit between S/TEMs that may produce unpredictably altered results that cannot be reproduced. Each machine provides fractions of a full dataset that must be combined to provide enough evidence of an atomic mechanism or reaction.

Current S/TEMs cannot switch between imaging modes quickly enough to capture diffraction data, atomic-scale STEM chemical maps, high-resolution TEM images, and ultrafast TEM images from a dynamic reaction in a material. Therefore, the adaptive multimodal S/TEM of the present invention allows for concurrent optimized electron beams for multiple imaging modes with optimal electron and photon collection, permitting enhanced characterization of dynamic process at atomic resolution. This integrated TEM combines optimized electron optics for electrostatic switching between different imaging modes, with an adjustable specimen chamber optimized for complete environmental control and signal collection, followed by a projection system designed to move the transmitted beam to various electron detectors.

For current S/TEM designs, most attempts to characterize samples in harsh environments in situ have been limited to modifications to the stage itself. However, although many S/TEM experiments demonstrate control over several environmental variables at once, their accuracy of control or measurement may be only within 10-15% of the real values, and few have been able to holistically encompass the experimental conditions required to achieve true operando control that allows for the imaging of partial states and non-equilibrium conditions that accurately reproduce the operational conditions of the material's application space. See Y. Li et al., *Nat. Commun.* 6, 7583 (2015); and H. Ellingham, *J. Soc. Chem. Ind.* (London) 63(5), 125 (1944). In contrast, a fully operando experiment would offer complete environmental control over the material: in surface chemical adsorption, mass flow, temperature flux, liquid or gas pressure, applied force, and in an applied external magnetic or electric field. This breadth of options would allow for accurate experimental verification that could feed into predictive models and accelerate the design and implementation of new materials into current and future applications.

The steady bifurcation of the electron microscopy field, which is illustrated in FIG. 1A, has been caused by specific enhancements to the electron optics, sample environment, or data collection which impose limits on techniques that could otherwise be performed simultaneously or sequentially. Despite this general trend, efforts have been made by many research groups to overlap techniques. FIG. 1B provides a schematic of the potential overlap of related and commonly combined in situ techniques that control the local stressors and the S/TEM sample environment during real-time observation. A fully operando characterization of fundamental site-specific chemical and structural phenomena is illustrated in FIG. 1C. Such a characterization would be able to unlock the design rules necessary for overcoming critical problems in material failure, wear, fracture, fatigue, corrosion, operational hysteresis, phase transformations, aggregation, and numerous other destructive and complicated challenges facing the materials science community.

Therefore, the present invention is directed to an all-encompassing integrated TEM that juxtaposes a range of advanced analytical and in situ S/TEM techniques. This microscope provides a characterization platform unmatched by other techniques for site-specific sub-nanometer resolution imaging, diffraction, and spectroscopy that can identify new materials phenomena under stimuli/environments that have never been investigated previously at the atomic and nanoscales.

SUMMARY OF THE INVENTION

The present invention is directed to an integrated TEM, comprising an electron illumination system comprising at least two electron sources with associated condenser lenses, each providing a separate electron beam, and an incident beam electrostatic deflector to direct one of the electron beams to illuminate an electron-transparent sample and deflect the remaining electron beams to one or more beam dumps; a sample chamber comprising a sample holder to steady and manipulate the sample, an upper objective lens to collimate the illuminating beam on the sample, and a lower objective lens to image the transmitted beam; and a projection system comprising a projection lens and a transmitted beam electrostatic deflector to project and deflect the transmitted beam image onto a detection chamber comprising at least two detectors. For example, the at least two electron sources and associated condenser lenses can comprise at least one of an aberration-corrected TEM, an ultrafast pulsed imaging TEM, and a scanning probe TEM. The incident beam electrostatic deflector can redirect the at least two electron beams within a time frame of less than one microsecond. The gap between pole pieces of the upper objective lens and the lower objective lens can be adjustable.

The integrated TEM combines optimized electron optics for electrostatic switching between different imaging modes, with an adjustable specimen chamber optimized for complete environmental control and signal collection, followed by a projection system designed to move the transmitted beam to various electron detectors. The invention provides a state-of-the-art adaptive multimodal S/TEM that allows for concurrent optimized electron beams for multiple imaging modes with optimal electron and photon collection permitting enhanced characterization of dynamic process at atomic resolution.

BRIEF DESCRIPTION OF THE DRAWINGS

The detailed description will refer to the following drawings, wherein like elements are referred to by like numbers.

FIG. 1A illustrates current bifurcation of the electron microscopy field. FIG. 1B illustrates the current standardized controllable and overlapping stressors. FIG. 1C illustrates combined environments obtainable with the integrated TEM for operando experiments.

FIG. 3A illustrates a current sample chamber. A sample is positioned between the two metallic cones (fixed upper and lower pole pieces of the objective lenses). FIG. 3B illustrates a sample chamber of the integrated TEM. The sample is positioned between adjustable pole pieces providing an expanded gap. The expanded gap allows for more stimuli (e.g., ions, laser, feedthroughs), detectors (e.g., backscattered electrons, X-rays, light), and specimen manipulation with a feedthrough-integrated (liquid/gas lines) cartridge design while retaining the objective aperture for imaging. Gaps in the pole piece structures enable differential pumping apertures for gaseous experiments of an environmental transmission electron microscope.

DETAILED DESCRIPTION OF THE INVENTION

Multimodal in situ experiments are the wave of the future, as this approach will permit multispectral data collection and analysis during real-time nanoscale observation. Therefore, the present invention is directed to a S/TEM that integrates recent advancements in aberration-corrected TEM, probe-corrected STEM, ultra-fast TEM, and dynamic TEM with an adaptive in situ testing chamber. This integrated TEM can provide a holistic understanding of the underlying physics and chemistry of the process-structure-property relationships in materials exposed to controlled extreme environments. The microscope further provides the ability to explore active reaction mechanisms in a controlled manner emulating those of real-world applications with nanometer and nanosecond resolution. The microscope has the potential to revolutionize our materials understanding of nanoscale mechanisms and transients.

Building off the integrated toolbox concept presented by I. M. Robertson, et al., the present invention provides an experimentally versatile, adaptive platform of an integrated transmission electron microscope for site-specific, operando, atomic-scale structural and compositional characterization. See I. M. Robertson et al., *J. Mater. Res.* 26(11), 1341 (2011). By capitalizing on the advancements in particle physics (super conducting magnets, fast switching electrostatic deflectors, and high sensitivity detectors), as well as electrical engineering (faster circuitry) and computer science (advanced control algorithms), the microscope can be constructed using current technology.

The integrated TEM features three major deviations from the current configuration of commercial electron microscopes:

A. An electron illumination system that is interconnected by an electrostatic lens directly over an objective lens pole piece providing fast and rapid switching between imaging, diffraction, and spectroscopy modes.

B. A robust and flexible specimen assembly in the objective lens pole piece and chamber design that customizes the experiment in a gap under extremes by opening up the largest steradians possible.

C. An imaging, projection, and spectrometer system designed to utilize all the electron, photons, ions, and other signals that transmit through or are produced by the sample for imaging and spectral analysis.

Figure 1A:
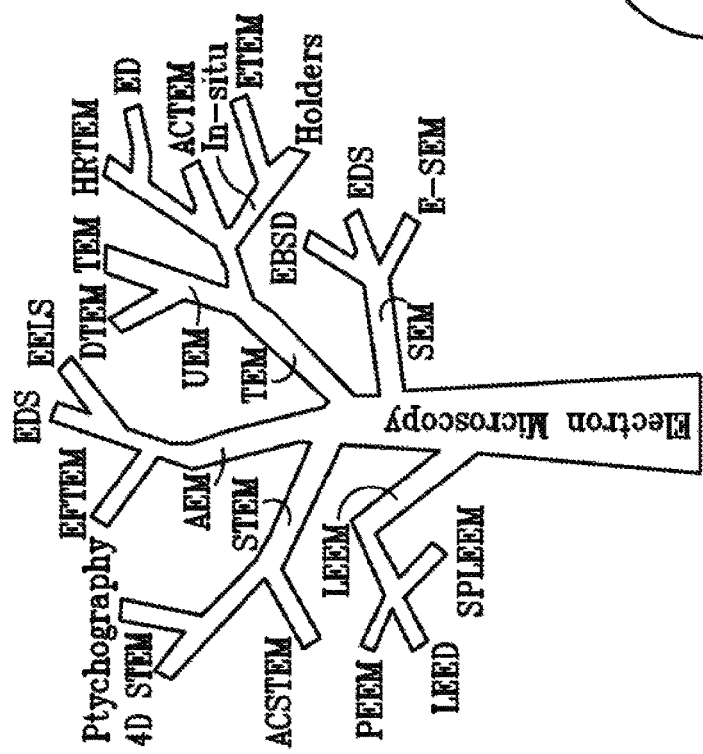
FIGS. 1A, 1B, and 1C show current and perspective abilities for imaging/data collection modes and combined in situ experiments in a S/TEM.
Figure 1B:
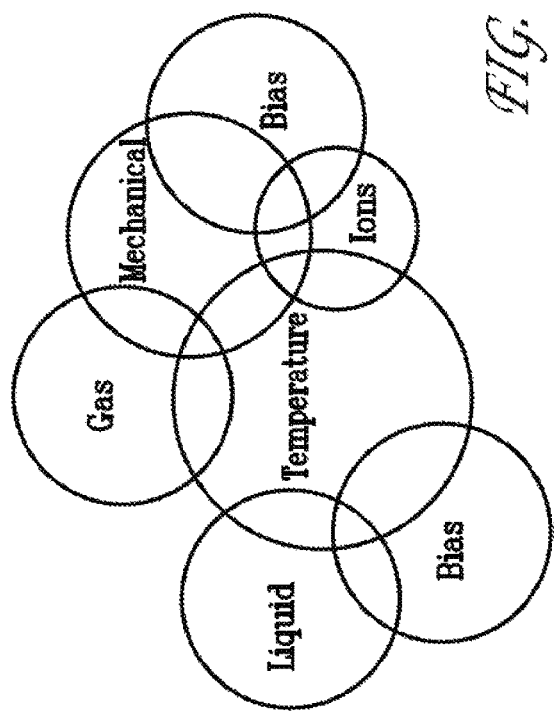
Figure 1C:
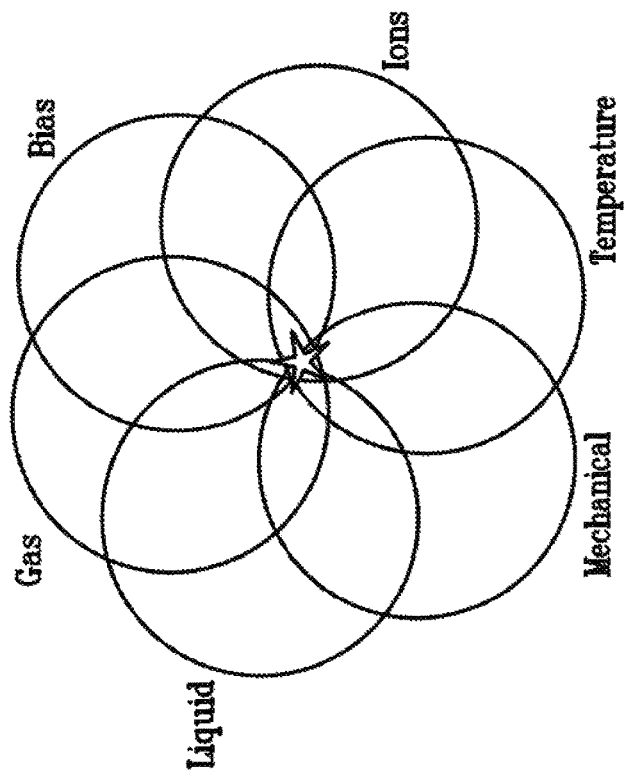
Figure 2:
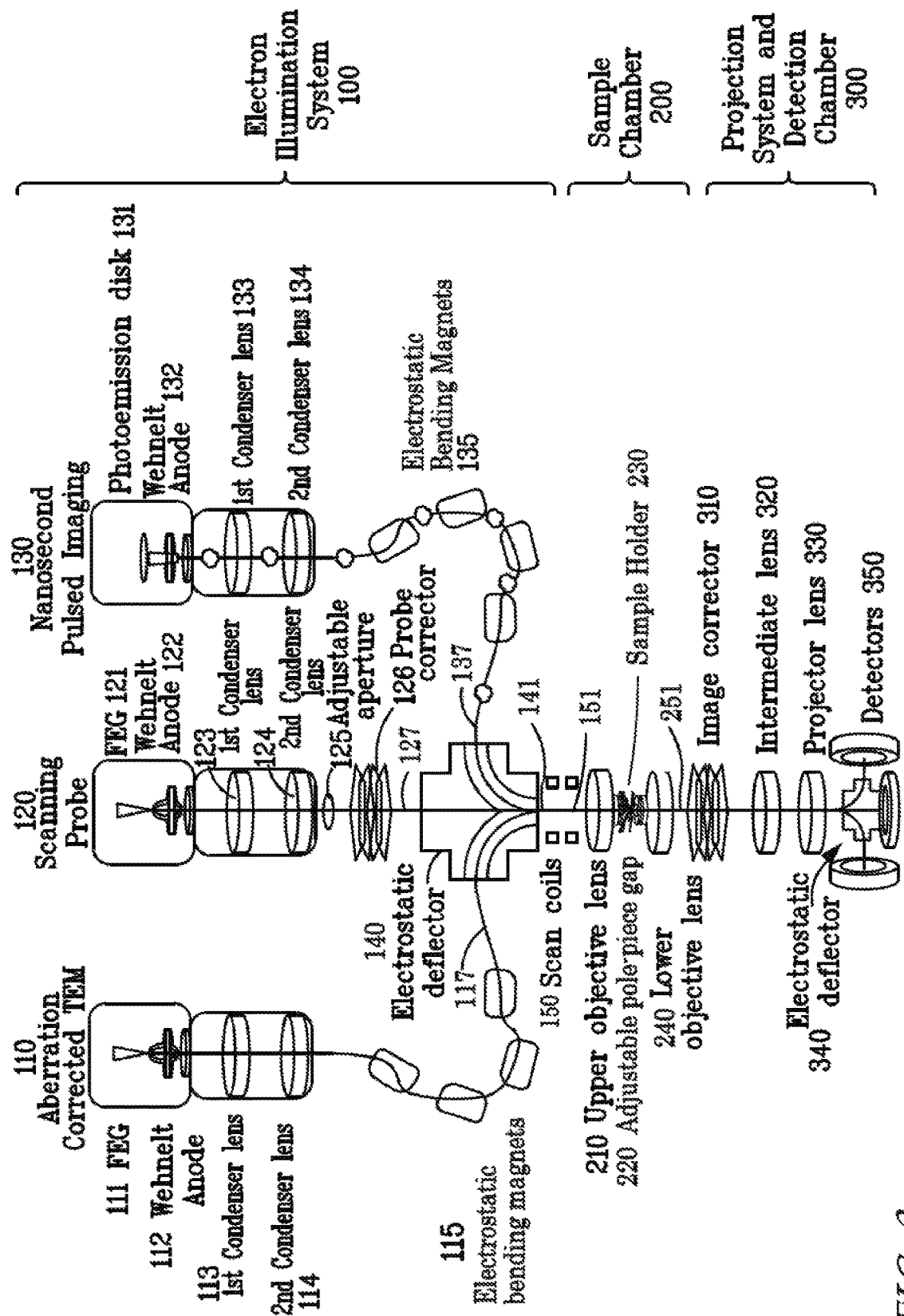
FIG. 2 is a schematic illustration of an exemplary integrated TEM with a multifaceted illumination system, an open-designed sample region, and a detection assembly design to synchronize imaging modes to detectors/cameras/spectrometers.

FIG. 2 is a schematic illustration of an exemplary integrated TEM of the present invention. The three main sections of the integrated TEM comprise an electron illumination system 100 that provides multiple electron beams to illuminate a sample, a sample chamber 200 that holds the sample and forms and image of the transmitted beam, and a projection system and detection chamber 300 that magnifies and projects the imaged beam onto an appropriate detector in a detector housing. The three main sections can be designed to create an optimal electron beam hitting a sample while using the full electron, x-ray, and optical signals emitted from the sample to probe the composition and bonding structure in the sample material and whilst using the fewest number of high-energy electrons possible to prevent damage to the sample. The electron illumination system 100 provides three optimized beams 117, 127, and 137 from three different TEM sources 110, 120, and 130 that can be rapidly switched on- and off-axis by an electrostatic deflector 140 to illuminate a sample in the sample chamber 200. The sample is located in a sample holder 230 that sits between upper 210 and lower 240 objective lenses with scan coils 150 positioned before the objective lenses, similar to the current TEM design standard. The projection system 300 of the microscope can be designed to be as wide open as possible with an adjustable camera length, so that as many data signals (electrons, photons, etc.) can be collected and analyzed. Electrostatic deflection of the transmitted electron beam to multiple detectors 350 can be used for fast read-out of multiple signal sources from the alternating imaging beams. The utilization of advanced control systems that use recent advancements in the field, including machine learning and system prioritizations, can be made in real-time for each of the components individually, and the system as a whole, to maximize electron stability in the microscope and minimize the alignments that must be done by the instrument operator. A graphical user interface (GUI) can be used to set up the experimental conditions in advance, so that the timing between the imaging modes can be predefined or set to trigger based on feedback from detectors that monitor physical properties from the specimen (temperature, stress, charge, chemistry, etc.).

Electron Illumination System

The electron illumination system 100 represents the greatest departure from current commercial TEM designs. The electron illumination system 100 comprises multiple electron sources and illumination optics that are combined just before the objective lens of the integrated TEM. Because the incompatible electron optical ray pathways of the numerous current electron microscope optics designs cannot be fully integrated in a single column above the specimen or sample without compromising the operation of these advanced modes, or without introducing a significant timing delay, the integrated TEM retains optimized ray pathways for all of the advanced illumination modes, then couples each to the objective lens pole piece through the rapidly switchable electrostatic lens 140. The exemplary electron illumination system 100 combines an aberration-corrected TEM 110, scanning probe TEM 120, ultrafast (nanosecond pulse) imaging TEM 130. See T. LaGrange et al., *Ultramicroscopy* 108, 1441 (2008). With this configuration, it is possible to switch between the image-corrected TEM 110, probe-corrected STEM 120, and dynamic TEM 130 with intervals on the order of nanoseconds, which will enable imaging of transient states of materials in all of these modes during a single experiment. The general design of each of these upper sections has been refined over the last few decades and is available in the electron microscopy literature. See D. B. Williams and C. B. Carter, *Transmission Electron Microscopy: A Textbook for Materials Science*, edition 2, Springer US (2009). However, the present invention is not limited to only these imaging sources and illumination optics.

The multiple beam pathways 117, 127, and 137 can be directed into an electrostatic deflector 140 equipped with one or more beam dumps to blank the deflected beams from illumination of the sample and to measure the electron fluence of each beam with a Faraday cup. The unblanked beam 141 can be directed down the axis of the microscope column to illuminate the sample in the sample holder 230. Therefore, the optical configuration of the TEM can be rapidly changed by the electrostatic deflector 140 via rapid electrical switching of the beams 117, 127, and 137 with minimal uncompensated hysteresis, aberrations, or artifact inclusions. As an example, one of the optimal beam pathways can be dedicated for the aberration-corrected TEM 110, which consists of a field-emission gun (FEG) 111, a Wehnelt anode 112, and two condenser lenses 113 and 114 for initial electron beam formation, all in standard configuration of current TEM designs. This beam 117 can be directed into the electrostatic deflector 140 using electrostatic bending magnets 115 to bend the beam while retaining beam coherency. A second beam 127 can be optimized for the scanning probe TEM 120 with electrons emitted from a FEG 121 passing through a Wehnelt anode 122 and two condenser lenses 123 and 124 that shape the probe beam, and then the optimal region of the probe beam can be selected with an adjustable aperture 125. The adjustable aperture 125 can be used to tune the aperture size to the aberration-free center of the Ronchigram. The adjustable aperture 125 allows for precise tuning of the electrons forming the probe, allowing for more versatility than a fixed aperture size. The electron beam can then travel through a probe corrector 126 to reduce aberrations in the probe and reduce the probe size below 80 picometers in diameter. This on-axis beam 127 can pass directly through the electrostatic deflector 140, requiring no beam deflection. Scan coils 150 above the sample region provide imaging through raster scanning and elemental mapping of the sample. A third beam line from the dynamic nanosecond pulsed imaging TEM 130 for imaging 'transient states' in materials can be optimized for nanosecond pulses, including a photoemission disk 131, a Wehnelt anode 132, and two condenser lenses 133 and 134. The electrostatic bending magnets 135 can bend the beam 137 into the electrostatic deflector 140.

Each of the off-axis electron beam pathways 117 and 137 from the electron sources to the sample can be bent on-axis prior to the objective lens, using the electrostatic bending magnets assemblies. The heart of this integrated design is the very fast, easily programable, and reliable electrostatic deflector 140 that can switch between the multiple illumination systems in the sub-microsecond time frame. The high voltage, fast, electrostatic deflector 140 can provide the greatest switching rate with minimal hysteresis in the electron packet before and after switching. Care can be taken in the design and production of the plates in the deflector to minimize any beam spatial or temporal distortions in the electron optics of each individual path. This permits imaging at various magnifications or other electron microscopy conditions during the collection of a chemical [energy dispersive spectroscopy (EDS) or electron energy loss spectroscopy (EELS)] or structural map [precession electron diffraction (PED)] of the sample with only minor loss of data during the EDS, EELS, or PED maps. In addition, this fast switching minimizes the damage to electron sensitive samples, such as biological or other organic compounds (e.g., metal-organic frameworks), by limiting the dose during the shuttering process. Variation in electron sources and accelerating voltages can be different between each electron beam 117, 127, and 137. A beam dump for each electron beam permits the illumination optics of each section to operate under normal conditions to deflect the beam as needed by the electrostatic deflector 140. Each beam dump can serve a dual purpose as an electron beam profile monitor to permit the continuous characterization (electron fluence detection) and refinement of each electron beam when not illuminating the sample. This minimizes drift in each of the electron illumination systems 110, 120, and 130, which greatly minimizes any hysteresis in the illumination optics, thereby providing the most stable imaging conditions possible.

Sample Chamber

Current TEM designs encounter problems with operando environmental control and quantitative property measurements, where the structure-property measurement is coincident with the site-specific region of the sample being investigated. Commercially available in situ sample holders somewhat mitigate the problem by increasing control over the specimen or sample through coupled environmental control and property measurements (nanoindentation, biasing, heating, cryogenic temperatures, and electrochemistry), and several of these holders even have built-in double-tilt capabilities or combine temperature control with biasing, liquids, gasses, or mechanical loading. However, each capability generally requires a completely different sample holder and there are mechanical limitations in the current sample holder designs that limit innovation. For example, the sample holder's tip geometry is limited by the objective lens pole piece gap, and both the sample mounting configuration and the feedthroughs (for controlling the electrical bias, mechanical loading, liquid/gas tubing, and property measurements) are limited by the inner diameter of the side-entry sample holder. The experimental area is further limited by the restrictive number of experimental input/output ports and by the dimensions of the holder tip (~3 mm×~10 mm) and rod (~250 mm long, ~8 mm in diameter). However, this limitation is not inherent to the TEM experiments, rather, it is historically rooted in the standard design of a commercial TEM pole piece, shown in FIG. 3A. The sample is positioned between the two magnetic metallic cones (upper and lower pole pieces 411 and 441 of the objective lenses 410 and 440, respectively, of the microscope) by the sample holder 430. An x-ray detector 421 is commonly positioned near the specimen for EDS characterization. Several individual research groups have made initial attempts to increase the types of experiments that can be observed, primarily by statically increasing the pole piece gap to make room for additional instrumentation. See F. M. Ross and J. M. Gibson, *Phys. Rev. Lett.* 68(11), 1782 (1992); and D. Hojo et al., *Thin Solid Films* 515(20-21), 7892 (2007). In these early experiments, the sacrifice in spatial resolution proved to be high. However, E. A. Stach and others have shown that new aberration correction techniques can be used to increase the pole piece gap, while retaining angstrom resolution. See P. Ferreira et al., *MRS Bull.* 33(2), 83 (2008).

The sample chamber of the present invention departs from the rod-based TEM sample mount design and utilizes the full volume of the objective lens pole piece area for control of environment/stimuli, sample manipulation, property measurements, and signal detection. An exemplary sample chamber, illustrated in FIG. 3B, utilizes three mechanical changes that can open up the entire experimental region ($4\pi$ steradians minus the cones of the objective lens pole piece), allowing individual users to find an optimal balance between maneuverability and resolution for multimodal in situ experiments.

1) The quantity and strategic placement of the surrounding pole-piece gap ports can be improved to increase the detection accessibility. Removing steric restrictions around the sample also allows for the integration of complementary photon characterization techniques (EDS, CL, IBIL, Raman, TDTR, TGS, etc.).

2) A removeable/interchangeable top-entry loading configuration can be included to connect to additional stimuli feedthroughs, like the one successfully implemented by Bayer et al. See B. C. Bayer et al., *ACS Nano* 12(8), 8758 (2018).

3) An adjustable pole-piece gap can be added to provide increased access for the most complex multimodal experiments. This spatial resolution flexibility allows researchers to tune the instrument for any given experiment or measurement, trading spatial resolution for increased collection angle in near-sample detection, sample tilt, or increased coincident stimuli on the sample. Similarly, adjustable pole piece gap systems are already common in particle physics. See H. Enge and W. Buechner, *Rev. Sci. Instrum.* 34(2), 155 (1963).

FIG. 3B illustrates a sample chamber of the integrated TEM of the present invention. The upper objective lens 210 collimates the incident electron beam 151 onto the sample and the lower objective lens 240 focuses the electron beam 251 that is transmitted through the sample onto an image plane. The magnetic field around the sample can be controlled in the standard manner by the objective lenses of the microscope. The control system can compromise between changing the objective lens current to maximize the imaging condition for each illumination technique and minimize the change to decrease the distortions that are introduced by the slow changing and hysteretic magnetic field. The two sections of the magnetic lens can be engineered on an adjustable mount, so that the distance between the upper and lower objective pole pieces 211 and 241, respectively, can be customized for the experiment and optimal imaging conditions without compromising the operation of the objective lens. The sample holder 230 can be positioned in a goniometer directly above the lower objective lens 240. The upper objective lens 210 can be connected to the microscope column by bellows that allows adjustment of the distance between the upper and lower objective lenses 210 and 240 using a motorized adjustment. The expanded gap 222 between the pole pieces 211 and 241 allows for more stimuli (laser 223, ions 224, feedthroughs/wires 225), detectors [backscattered electrons 226, X-rays (227, x4), and light 232], and sample manipulation with feedthrough-integrated liquid/gas lines 229 into the cartridge housing 231 while retaining the objective aperture for imaging. Gaps in the pole piece structures provide differential pumping apertures for gaseous experiments of an environmental TEM. This adaptive specimen assembly permits simultaneous in situ heating, cooling, gas/liquid, electrical biasing, straining (indentation, compression, wear, fatigue, bending, etc.), irradiation (laser, electrons, and ions), and ion implantation, greatly increasing the number and combinations of stressor environments and analytical detectors that can be used to probe the sample, with the combined ability for the researcher to rapidly switch between various advanced microscopy techniques (CTEM, STEM, DTEM, etc.).

Projection System and Detection Chamber

The projection system of the microscope can be designed to be as wide open as possible with an adjustable camera length, so that as many data signals (electrons, photons, etc.) can be collected and analyzed. This can include detectors for IR, visible, UV, and X-ray emissions around the sample with the greatest steradian collection angles possible. This can be achieved with a large inner diameter projection system with adjustable distance from the sample to a plurality of annular solid-state detectors. Electrostatic deflection of the transmitted electron beam to multiple detectors is necessary for fast read-out of multiple signals sources from the alternating imaging beams.

Returning to FIG. 2, the transmitted beam 251 from the sample can travel through the path with an image corrector 310 before entering the intermediate lens 320. The beam then travels through a projector lens 330 where it can be deflected by an electrostatic deflector 340 into different detectors 350 that are positioned along different faces of a detector housing. The angles of the placement of the detectors is related to the number of detectors/cameras/spectrometers to optimize the beam deflection onto their sensors.

Figure 4:
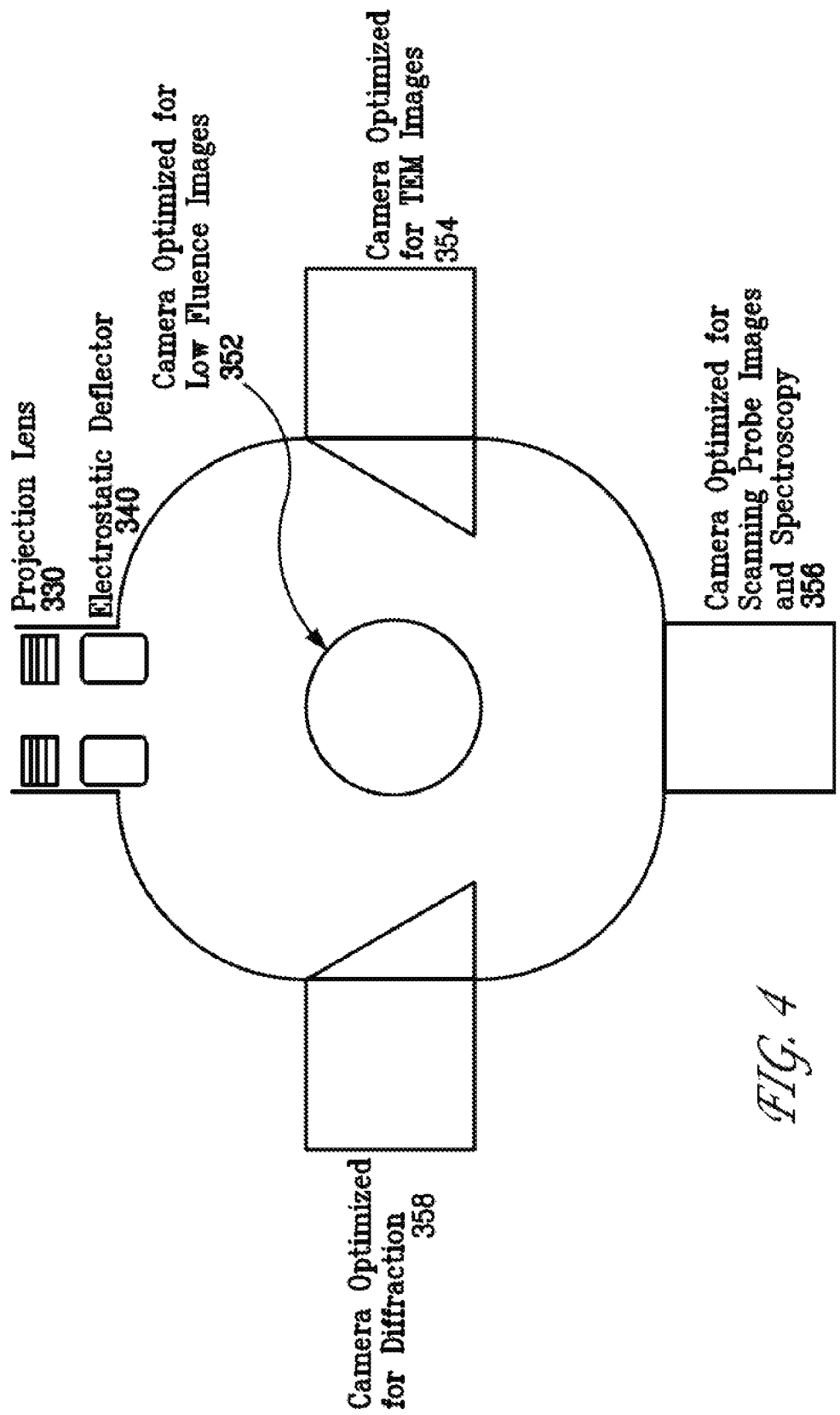
FIG. 4 is a schematic illustration of the detection chamber at the end of the integrated TEM that enables rapid electrostatic deflection of the beams between various detectors/cameras/spectrometers.

A projection system is used to magnify and project the imaged beam onto an imaging device or detector. As shown in FIG. 4, up to 5 detectors (4 detectors 352, 354, 356, and 358 are shown) can be mounted on the detector housing, which allows for switching with an electrostatic deflector 340 between optimized beams passing through the projector lens 330. The detectors are not limited by read-out delays, since a beam can be deflected onto another detector or another beam pathway can be directed through the sample onto a different detector while the first detector reads out the initial signal. A spectrometer can be conveniently placed at the bottom mount on the camera block as a detector. Switching between imaging modes can be rapid and flawless, with data analysis processed on the fly. This fast switching is enabled by control systems and data handling algorithms that draw on recent discoveries in automated control, machine learning, and big data processing to permit programed experimental order operations, rapid response to experimental conditions, data transfer, data processing, and data filtering.

Signal Detection Synced to Imaging Modes

Over the last decade, there have been extensive advances made in both direct and multimodal detection systems, greatly improving the spatial and temporal resolution of TEM cameras, as well as the energy resolution of EELS detectors. See B. E. Bammes et al., *J. Struct. Biol.* 177(3), 589 (2012); V. Migunov et al., *Sci. Rep.* 5(1), 1 (2015); A. Faruqi and G. McMullan, *Nucl. Instrum. Meth. A* 878, 180 (2018); C. Gammer et al., *Appl. Phys. Lett.* 112(17), 171905 (2018); and O. L. Krivanek et al., *Ultramicroscopy* 203, 60 (2019). These developments have greatly enhanced state-of-the-art analytical characterization, even permitting imaging of single atoms, single vacancies, and even isotopic variations. See Y. Zhu et al., *Nat. Mater.* 8(10), 808 (2009); J. A. Rodriguez-Manzo and F. Banhart, *Nano Lett.* 9(6), 2285 (2009); R. Ishikawa et al., *Ultramicroscopy* 151, 122 (2015); and J. A. Hachtel et al., *Science* 363(6426), 525 (2019). However, these advanced detectors have only rarely been applied to in situ and operando measurements, partly because they are often incompatible with the instrumentation and partly b cause the programming does not easily sync with in situ techniques. See C. Gammer et al., *Appl. Phys. Left.* 112(17), 171905 (2018); R. Ramachandramoorthy et al., *ACS Nano* 9(5), 4675 (2015); and M. L. Taheri et al., *Ultramicroscopy* 170, 86 (2016). This bifurcation was not intentional, and may reflect researcher community general hesitation to risk expensive TEM equipment with the introduction of liquid or lasers. See H. Zheng et al., *MRS Bull.* 40(1), 12 (2015).

The increased physical access to the sample in the integrated TEM enables a greater coupling of analytical and in situ capabilities because the additional space for sample-adjacent detectors should also permit a greater number of the photons (visible and X-ray), electrons (forward and back scattered), and any other particle or molecule released from the sample during observation or in situ testing. In terms of the adaptive imaging modes, signal detection can be synchronized to the correlated incident electron beam source, to properly direct the post-specimen electrons onto the camera/detector/spectrometer. This microscope additionally allows for a continuous imaging mode to be split between different detectors using electrostatic deflectors, which enables the collection of higher and lower magnification TEM images or videos with merely nanoseconds lost for switching delays. Just as importantly, this capability facilitates the acquisition of complex experiments and data sets that may greatly increase our ability to understand and explore the fundamental science at the nanoscale.

The present invention has been described as an integrated transmission electron microscope. It will be understood that the above description is merely illustrative of the applications of the principles of the present invention, the scope of which is to be determined by the claims viewed in light of the specification. Other variants and modifications of the invention will be apparent to those of skill in the art.

We claim:
1. An integrated transmission electron microscope, comprising:
   an electron illumination system, comprising
      at least two electron sources with associated condenser lenses, each providing a separate electron beam, and
      an incident beam electrostatic deflector to direct one of the electron beams to illuminate an electron-transparent sample and deflect the remaining electron beams to one or more beam dumps;
   a sample chamber, comprising
      a sample holder to hold and manipulate the sample,
      an upper objective lens to collimate the illuminating beam on the sample, and
      a lower objective lens to image a transmitted beam; and
   a detection chamber, comprising at least two detectors, and
      a projection system comprising a projection lens and a transmitted beam electrostatic deflector to project and deflect the transmitted beam image onto one of the at least two detectors.

2. The integrated transmission electron microscope of claim 1, wherein the at least two electron sources and associated condenser lenses comprises at least one of an aberration-corrected transmission electron microscope (TEM), an ultrafast pulsed TEM, and a scanning probe TEM.

3. The integrated transmission electron microscope of claim 1, wherein the incident beam electrostatic deflector can redirect the at least two electron beams within a time frame of less than one microsecond.

4. The integrated transmission electron microscope of claim 1, wherein a gap between pole pieces of the upper objective lens and the lower objective lens is adjustable.

\* \* \* \* \*